US006807656B1

(12) United States Patent
Cao et al.

(10) Patent No.: US 6,807,656 B1
(45) Date of Patent: Oct. 19, 2004

(54) DECOUPLING CAPACITANCE ESTIMATION AND INSERTION FLOW FOR ASIC DESIGNS

(75) Inventors: Lihui Cao, San Jose, CA (US); Prasad Subbarao, San Jose, CA (US); David Gradin, Boring, OR (US); Maad Al-Dabagh, San Jose, CA (US); Weidan Li, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/407,065

(22) Filed: Apr. 3, 2003

(51) Int. Cl.[7] .......................... G06F 17/50; G06F 9/45; G01R 13/00
(52) U.S. Cl. .................. 716/4; 716/2; 716/5; 716/10; 702/69
(58) Field of Search .................. 716/1, 2, 4, 5, 716/10; 703/14, 16, 19; 702/69, 117; 438/17, 57, 129; 326/27; 324/628; 257/369

(56) References Cited

U.S. PATENT DOCUMENTS

| | | | | |
|---|---|---|---|---|
| 5,568,395 A | * | 10/1996 | Huang | 716/4 |
| 6,353,248 B1 | * | 3/2002 | Reith et al. | 257/369 |
| 6,446,016 B1 | * | 9/2002 | Zhu | 702/69 |
| 6,523,159 B2 | * | 2/2003 | Bernstein et al. | 716/10 |
| 6,539,527 B2 | * | 3/2003 | Naffziger et al. | 716/5 |
| 6,618,844 B2 | * | 9/2003 | Dansky et al. | 716/5 |
| 6,640,331 B2 | * | 10/2003 | Trivedi et al. | 716/10 |
| 2002/0022951 A1 | * | 2/2002 | Heijningen et al. | 703/16 |
| 2002/0193959 A1 | * | 12/2002 | Wanek et al. | 702/117 |

FOREIGN PATENT DOCUMENTS

JP   02002288253 A  * 11/2002 ........... G06F/17/50

OTHER PUBLICATIONS

Larsson et al., "Parasitic resistance in an MOS transistor used as on–chip decoupling capacitance", Apr. 1997, Solid–State Circuits, IEEE Journal of, vol.: 32 Issue: 4, Page(s):574–576.*
Zheng et al.'Fast modeling of core switching noise on distributed LRC power grid in ULSI circuits', IEEE Transactions, vol.: 24, Issue: 3, Aug. 2001, pp.: 245–254.*
Su et al., "Optimal decoupling capacitor sizing and placement for standard–cell layout designs", Apr. 2003, IEEE Transactions vol.: 22 Issue: 4, pp.: 428–436.*
Chen, Howard H., "Power Supply Noise Analysis Methodology for Deep–Submicron VLSI Chip Design," IBM Research Division, 1997, pp. 638–643.

* cited by examiner

Primary Examiner—A. M. Thompson
Assistant Examiner—Helen Rossoshek
(74) Attorney, Agent, or Firm—Sawyer Law Group LLP

(57) ABSTRACT

A method for estimating decoupling capacitance during an ASIC design flow is disclosed. The method includes precharacterizing a set of power grid structures to model their respective noise behaviors, and storing the respective noise behaviors as noise factors in a table. During the ASIC design flow for a current design that includes at least one of the precharacterized power grid structures, the corresponding noise factor from the table is used to calculate decoupling capacitance for the current design.

27 Claims, 3 Drawing Sheets

US 6,807,656 B1

DECOUPLING CAPACITANCE ESTIMATION AND INSERTION FLOW FOR ASIC DESIGNS

FIELD OF THE INVENTION

The present invention relates to estimating decoupling capacitance, and more particularly to a decoupling capacitance estimation and insertion flow for ASIC designs.

BACKGROUND OF THE INVENTION

In deep sub-micron ASIC design, with decreasing supply voltages and noise margin, and higher clock speeds, core noise is one of the most significant signal integrity problems facing a chip designer. Core noise, or instantaneous voltage drop, is due to a large demand for current across a chip in a short period of time. Instantaneous voltage drop has been linked to the following problems in integrated circuits; high performance clock jitter (cycle-to-cycle), clock skew balanced delay chain matching and clock balancing, tight hold time margin paths and scan shift chain, and jitter sensitive I/O interfaces, such as DDR and source synchronous. Instantaneous voltage drop (IVD) can also cause functional failures if not addressed properly in the design phase.

One of the most effective ways to reduce power supply noise is to increase on-chip decoupling capacitance (dcap) by adding decoupling capacitors to the circuit layout. Decoupling capacitors can be designed into the layout before or after the design is complete. Although adding decoupling capacitors is an effective method for combating IVD, the current method for estimating and adding decoupling capacitors to a chip design has disadvantages.

One disadvantage is that an integrated package level and chip level power bus model with switching and timing information is needed to accurately analyze such voltage variations over time. The current static analysis methodology relies on average power calculations to analyze and design the power distribution. There is a deficiency in the current voltage drop analysis flow in that it only takes into account the average voltage drop. Peak currents may occur between four and five times the average current estimated by conventional analysis, resulting in short duration peak voltage drops between four and five times on the chip over what was predicted, not including the package and board voltage drop. Therefore, the number of decoupling capacitors that will be placed on the chip may not be adequate to handle the underestimation of the peak voltage drops.

Another disadvantage is that if the number of decoupling capacitors is initially underestimated by the voltage drop simulation, and more must be added after the chip design is complete, then the chip may no longer have an adequate amount of area to place the additional decoupling capacitors.

A further deficiency with the current dynamic spice-like voltage drop simulation is that it is slow and time-consuming. Once a chip design nears completion, further testing and analysis are performed, followed by refinements to the design, including the decoupling capacitors. With each iteration, the voltage drop simulation increases the time for that cycle to complete. With some designs, use of the simulation is not feasible in the overall ASIC design flow because of the slow turn-around time of the simulation and a limited capacity to handle large designs.

Accordingly, what is needed is an improved method for estimating the decoupling capacitance required for an ASIC design. The present invention addresses such a need.

SUMMARY OF THE INVENTION

The present invention provides a method for estimating decoupling capacitance during an ASIC design flow. The method includes precharacterizing a set of power grid structures to model their respective noise behaviors, and storing the respective noise behaviors as noise factors in a table. During the design flow for a current design that includes at least. one of the precharacterized power grid structures, the corresponding noise factor from the table is used to calculate decoupling capacitance for the current design.

According to the present invention, components that are commonly used in ASIC designs are precharacterized for future use in a table look-up approach, thereby eliminating the need to perform these steps during the actual design flow, and therefore reducing the time to perform the decoupling capacitance estimation.

DETAILED DESCRIPTION

The present invention relates to a decoupling capacitance estimation and insertion flow for ASIC designs. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown but is to be accorded the widest scope consistent with the principles and features described herein.

The present invention provides a decoupling capacitance estimation and insertion flow during ASIC design for core noise avoidance. In a preferred embodiment, the decoupling capacitance estimation and insertion flow is implemented as a software tool, or set of tools, that is executed by a conventional PC, workstation, or server. One part of the tool is run prior to ASIC design flow in which a set of off-the-shelf power grid and package structures are precharacterized to model their noise behavior, which is represented as a noise factor and stored in noise factor table. When architecting a new ASIC design, a designer selects which of the off-the-shelf power grid and package structures will comprise the design. During the ASIC design flow for the new design, the decoupling capacitance tool is used to calculate decoupling capacitance for the design using the prestored noise factors corresponding to the selected structures in the design. Based on the estimated decoupling capacitance, an appropriate area in the design is reserved for insertion of the required decoupling capacitors.

In accordance with one aspect of the present invention, the noise factor, on which the estimate of the decoupling capacitance for the current design is based, is calculated for each off-the-shelf power grid and package, such that a table lookup approach can be used to retrieve the corresponding noise factors during the decoupling capacitance calculation for a current design. By precharacterizing components of ASIC designs and using a table look-up approach, the present invention eliminates the need to perform these steps during the actual design flow using spice simulation, and therefore reduces the time to perform decoupling capacitance estimation. In addition, the decoupling capacitance estimation tool accounts for the decoupling capacitance area overhead upfront during chip size estimation and ensures that the chip always includes sufficient area required to place the decoupling capacitance cells.

Figure 1:
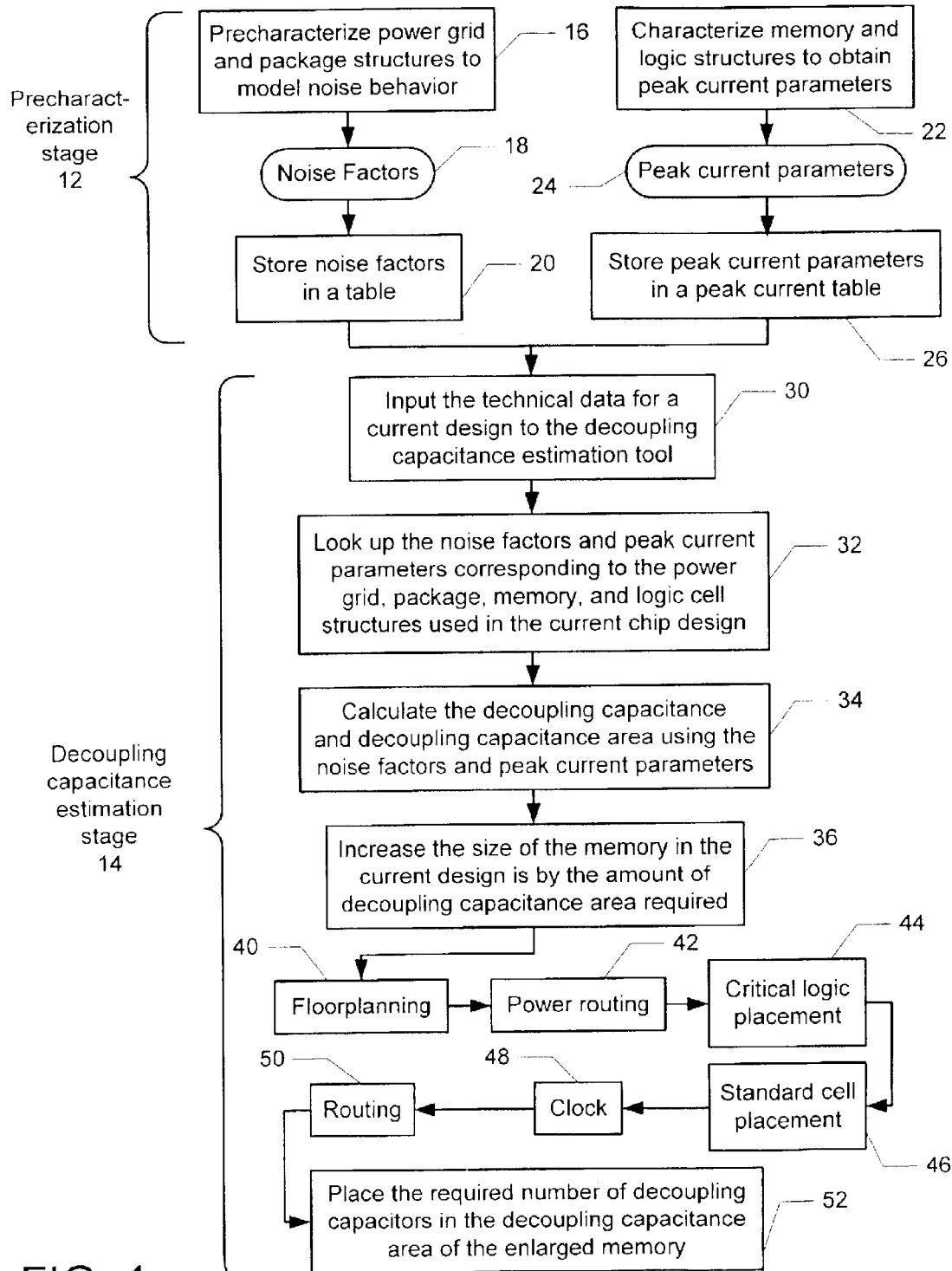
FIG. 1 is a flow chart illustrating a decoupling capacitance estimation and insertion flow in ASIC design for core noise avoidance in accordance with one preferred embodiment of the present invention.

FIG. 1 is a flow chart illustrating a decoupling capacitance estimation and insertion flow in ASIC design for core noise avoidance in accordance with one preferred embodiment of the present invention. The process includes two stages, a precharacterization stage 12, which is independent of a particular chip design, and a decoupling capacitance estimation stage 14, which is performed during the ASIC design flow of a particular chip design. The precharacterization stage 12 assumes the existence of off-the-shelf structures, including different types of power grids, packages, memories, and logic cells that can be used to design a custom chip. The set of off-the-shelf power grid and package structures are then precharacterized in step 16 to model their noise behavior, which is represented as a noise factor 18. The noise factors 18 are then stored in noise factor table in step 20.

In a preferred embodiment, the noise factors 18 are determined by performing resistance, capacitance, and inductance (RCL) modeling for the power grids and packages and spice decks are built and simulated with different combinations of processes, layer stacks, peak current values, peak width values, and time-to-peak values as inputs. The results are then stored in the noise factor table.

The precharacterization stage 12 also includes characterizing each of the memory and logic structures in step 22 to obtain a corresponding set of peak current parameters 24. The peak current parameters 24 are necessary for calculating the decoupling capacitance during ASIC design flow, described below. Each set of peak current parameters 24 are then stored in a peak current table in step 26. In alternative embodiments, the peak current parameters 24 may also be stored in the noise factor table or in a generic memory database. The calculation of the peak current parameters is explained further below.

The decoupling capacitance stage 14 occurs after a new chip has been designed using some combination of the off-the-shelf power structures. The process begins in step 30 by inputting technical data for the current design to the decoupling capacitance estimation tool. In step 32, the estimation tool looks up the noise factors and peak current parameters corresponding to the particular power grid, package, memory, and logic cell structures used in the current chip design. In step 34, the decoupling capacitance and the required decoupling capacitance area are calculated using the noise factors and peak current parameters.

In step 36, the size of the memory and hard macros used in the current design is increased by the amount of decoupling capacitance area required (preferably, by bloating their FRAM views). Thus, once the de-coupling capacitance values are available, the memory frame views are bloated to reserve areas for the de-coupling insertion later in the design flow. This way, when a memory or hardmac is moved around a little bit in the chip physical stage, the reserved dcap area will move along with the memory or hardmac. This ensures that the dcap is always close to the memory or hardmac, in other words, close to the high peak current source, increasing the de-coupling capacitor's effectiveness of reducing core noise.

After bloating the memory, the normal ASIC process flow continues with floor-planning 40, power routing 42, critical logic placement 44, standard cell placement 46, clock 48, and routing 50 steps. Finally, in step 52, the required number of decoupling capacitors are placed in the decoupling capacitance area of the enlarged memory or hardmac.

Figure 2:
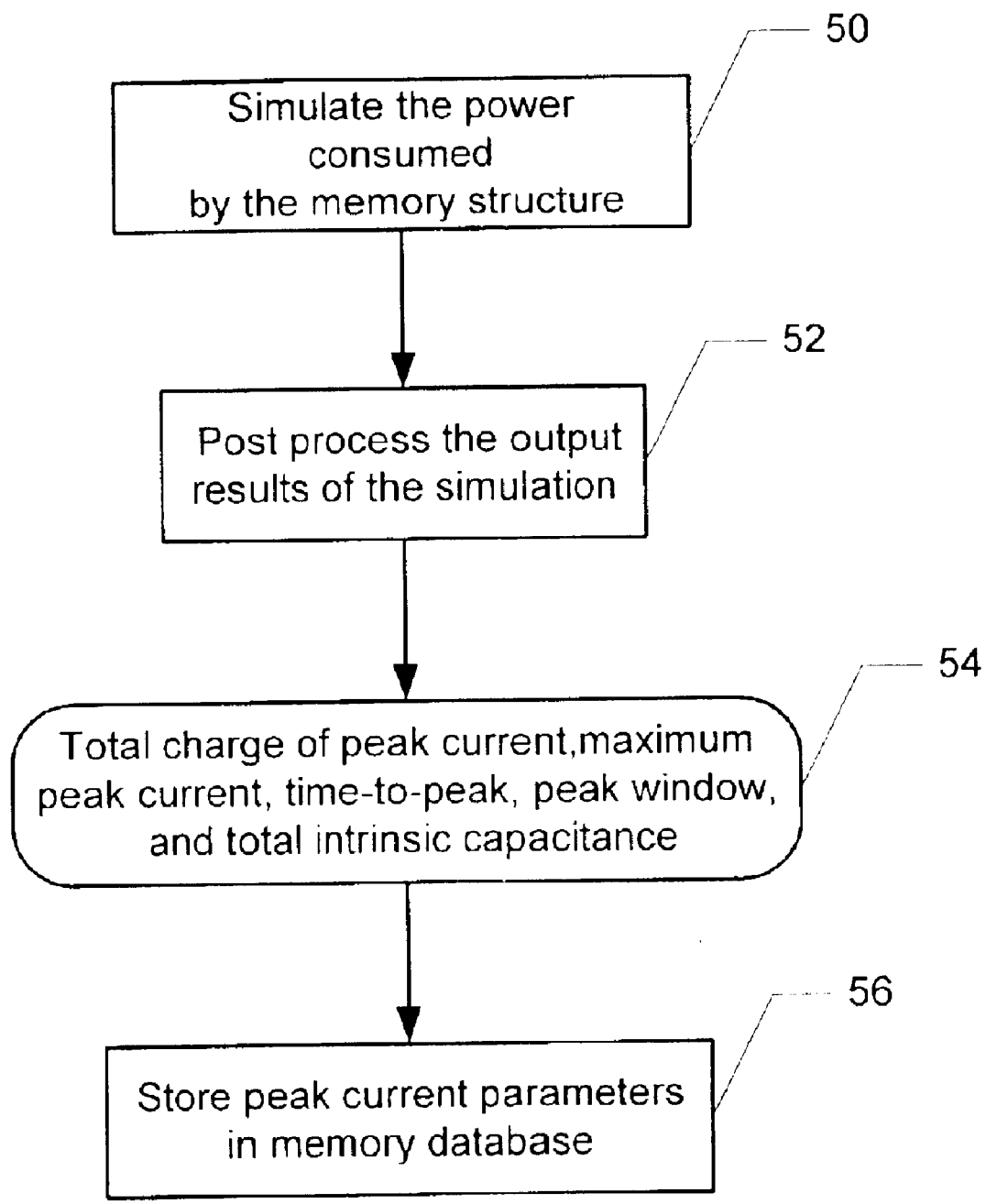
FIG. 2 is a flow chart illustrating a power characterization process in further detail.

Referring now to FIG. 2, a flow chart illustrating the power characterization process corresponding to step 22 of FIG. 1 is shown in further detail. The process begins by simulating the power consumed by the memory structure in step 50 using a power estimation tool. As is well known to one of ordinary skill in the art, a power estimator is a function that returns an estimated value for the power consumed by a functional block when given some relevant input specifications. An example of a commercially available power estimation tool is PowerMill by Synopsis, Inc. In a preferred embodiment, the memory is simulated at three process corners and worst case input vectors. An example set of initial process corners used as input may include the following:

Largest IVD: 1.26V, −40 C, SNSP.
Lowest IVD: 1.08V, 115 C, WNWP.
Normal IVD: 1.2V, 25 C, NOM.

A ramp time of 0.20 ns, rail-to-rail, may be used for all stimuli, and a 32× standard load may be used for all output loads for this analysis. The output of the simulation is a waveform of the current flowing out of a power source.

Figure 3:
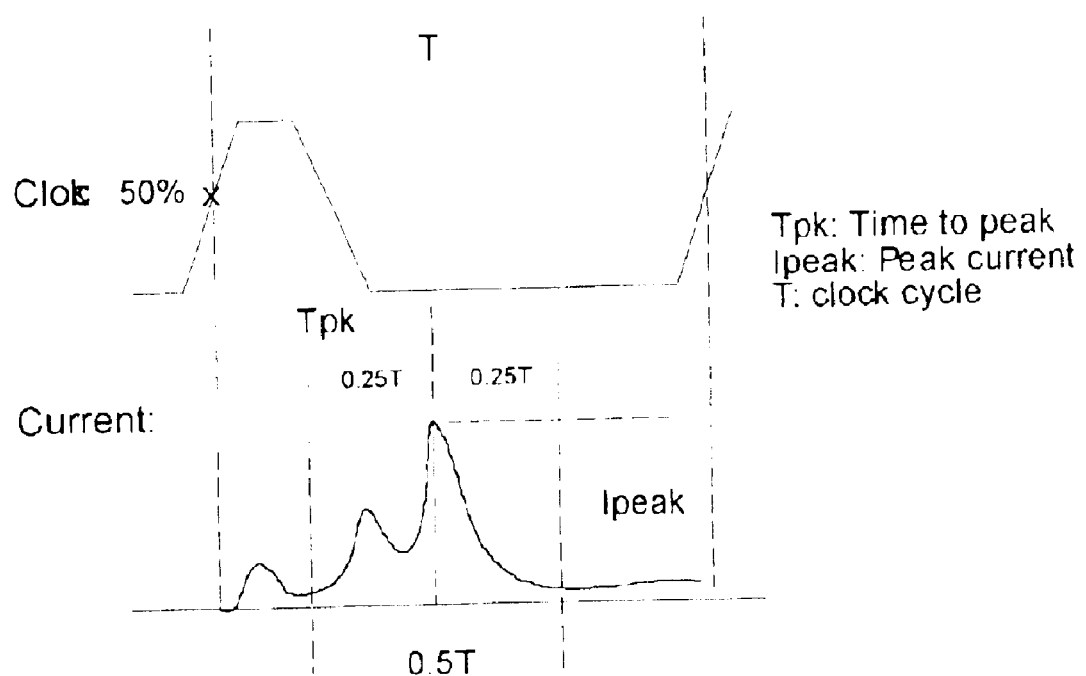
FIG. 3 is a diagram illustrating post processing on a waveform output by the simulation to obtain the peak current parameters.

FIG. 3 is a diagram illustrating post processing on a waveform output by the simulation to obtain the peak current parameters. For a specific memory configuration that is being characterized, T is defined as a minimum cycle time of the memory. A time window of 0.5 T, (0.25 T on both left and right side of the maximum peak) may be used to find the total charge within the maximum peak of the current. The variable Tpk corresponds to the time-to-peak value, and the variable Ipeak corresponds to the peak current value.

Referring again to FIG. 2, according to one aspect of the present invention, the output results of the power estimation tool are post-processed in step 52 to obtain a set of peak current parameters 54. In a preferred embodiment, the set of peak current parameters 54 may include the following: a total charge of peak current, maximum peak current, time-to-peak, peak window, and the total intrinsic capacitance. In step 56, the peak current parameters 54, which include the intrinsic capacitance are stored a memory database or other type of table.

Note, the power estimation tool simulations include device and interconnect capacitance, but do not include the memory intrinsic capacitance (n-well, non-switching circuits capacitance, and power mesh capacitance). According to another aspect of the present invention, the post-processing step calculates the intrinsic capacitance as follows.

The total intrinsic capacitance for a specific memory instance is expressed in pF. This parameter may include four main components: Nwell capacitance (Cnw), non-switching capacitance (Cns), metal grid capacitance, and internal decoupling capacitance. Cnw (n-well capacitance) is based on Nwell area.

$$Cnw=(Nwell\ area)*(Nwell\ capacitance\ parameter\ F/um**2),$$

where
Nwell area=N-well-parameter*memory-size
The N-well-parameter is a number to denote the ratio of n-well area to the memory size.
The Cns may be calculated as:

$$Cns=[P/(1-A)]/[VDD*2*freq*A],$$

where P=average power, A=internal memory switching activity, VDD=power supply voltage, and freq=operating frequency. A value for the total instrinsic capacitance can be obtained by extraction:

$$Ctotal = Cnw + Cns + Cm + Cdcap,$$

where Cm is the metal grid capacitance and Cdcap is the internal decoupling capacitance.

An alternative to calculating the intrinsic capacitance is to model the memory and determine these values directly through tables based on actual Hspice simulation results.

Referring again to FIG. 1, step 34 describes the process for performing a decoupling capacitance calculation. The decoupling capacitance may be calculated as:

$$C_{dec} = n \times Q / (\Delta Vlim)$$

where delta_Vlim=may be 10% of vdd, and Q is the current peak charge.

The number of decoupling capacitors that need to be added to the current design, Cdcap, may be calculated as:

$$Cdec - (Cn\text{-well} + Cns + Cpm)$$

where Cn-well is the n-well capacitance characterized for each cells, Cns is the non-switching circuit capacitance, and Cpm is the power mesh capacitance.

A fast-turn-around decoupling capacitance estimation and insertion flow in ASIC design for core noise avoidance has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

What is claimed is:

1. A method for estimating decoupling capacitance during a design flow, the method comprising the steps of:
   (a) performing a precharacterization stage independent of a particular design by,
      (i) precharacterizing a set of power grid structures to model their respective noise behaviors;
      (ii) storing the respective noise behaviors as noise factors in a table; and
   (b) performing a decoupling capacitance estimation stage during ASIC design flow for a current design that includes at least one of the power grid structures by,
      (i) using the corresponding noise factor from the table to calculate decoupling capacitance for the current design.

2. The method of claim 1 wherein step (b) further includes the step of: using the calculated decoupling capacitance to determine decoupling capacitance area overhead, and reserving that amount of area in the current design for placement of decoupling capacitors.

3. The method of claim 2 wherein step (a) further includes a step of: precharacterizing a set of package structures.

4. The method of claim 3 wherein step (a) further includes a step of: characterizing a set of memory and logic structures to obtain a set of peak current parameters for each of the memory and logic structures.

5. The method of claim 4 wherein step (b) further includes the step of: calculating the decoupling capacitance: using the noise factors and peak current parameters corresponding to the power grid structures, package structures, and memory and logic structures in the current design.

6. The method of claim 5 wherein the peak current parameters include a total charge of peak current, maximum peak current, time-to-peak, peak window, and a total intrinsic capacitance.

7. The method of claim 6 wherein the total intrinsic capacitance is calculated using Nwell capacitance, non-switching capacitance, metal grid capacitance, and internal decoupling capacitance.

8. The method of claim 1 wherein step (a) further includes the step of: determining the noise factors by performing resistance, capacitance, and inductance (RCL) modeling for the power grids and packages using different processes, layer stacks, peak current values, peak with values, and time-to-peak values as inputs.

9. The method of claim 1 wherein step (b) further includes the step of: calculating the decoupling capacitance by, Cdec=noise factor×Q/(ΔVlim).

10. The method of claim 2 wherein step (b) further includes the step of: calculating a number of decoupling capacitors that need to be added to the current design by, Cdcap=Cdec−(.Cn−well+Cns+Cpm).

11. A method for estimating decoupling capacitance during a design flow, the method comprising the steps of:
   (i) modeling a set of power grid structures to obtain respective noise factors for each;
   (ii) storing the noise factors in a first table;
   (iii) characterizing a set of memory, and logic structures to obtain respective sets of peak current parameters;
   (iv) storing the peak current parameters in a second table;
   (v) for a design that includes any combination of the power, package, memory, and logic structures, looking up the corresponding noise factors and peak current parameters from the first and second tables; and
   (vi) using the noise factors and peak current parameters retrieved from the tables to calculate decoupling capacitance and a number of required decoupling capacitors for the design.

12. The method of claim 11 wherein step (f) further includes the step of: calculating the decoupling capacitance by, Cdec=noise factor×Q/(ΔVlim).

13. The method of claim 12 wherein step (f) further includes the step of: calculating a number of decoupling capacitors that need to be added to the current design by, Cdcap=Cdec−(Cn−well+Cns+Cpm).

14. The method of claim 13 wherein step (f) further includes the step of: determining decoupling capacitance area overhead, and reserving that amount of area in the current design for placement of the decoupling capacitors.

15. The method of claim 14 wherein the peak current parameters include a total charge of peak current, maximum peak current, time-to-peak, peak window, and a total intrinsic capacitance.

16. The method of claim 15 wherein the total intrinsic capacitance is calculated using Nwell capacitance, non-switching capacitance, metal grid capacitance, and internal decoupling capacitance.

17. The method of claim 16 wherein step (a) further includes the step of: determining the noise factors by performing resistance, capacitance, and inductance (RCL) modeling for the power grids and packages using different processes, layer stacks, peak current values, peak with values, and time-to-peak values as inputs.

18. A computer readable medium containing program instructions for estimating decoupling capacitance during a design flow, the instructions for:
   (a) performing a precharacterization stage independent of a particular design by, (i) precharacterizing a set of power grid structures to model their respective noise behaviors;

(ii) storing the respective noise behaviors as noise factors in a table; and (b) performing a decoupling capacitance estimation stage during ASIC design flow for a current design that includes at least one of the power grid structures by, (i) using the corresponding noise factor from the table to calculate decoupling capacitance for the current design.

19. The computer readable medium of claim 18 wherein instruction (b) further includes the instruction of: using the calculated decoupling capacitance to determine decoupling capacitance area overhead, and reserving that amount of area in the current design for placement of decoupling capacitors.

20. The computer readable medium of claim 19 wherein instruction (a) further includes the instruction of: precharacterizing a set of package structures.

21. The computer readable medium of claim 20 wherein instruction (a) further includes the instruction of: characterizing a set of memory and logic structures to obtain a set of peak current parameters for each of the memory and logic structures.

22. The computer readable medium of claim 21 wherein instruction (b) further includes the instruction of: calculating the decoupling capacitance using the noise factors and peak current parameters corresponding to the power grid structures, package structures, and memory and logic structures in the current design.

23. The computer readable medium of claim 22 wherein the peak current parameters include a total charge of peak current, maximum peak current, time-to-peak, peak window, and a total intrinsic capacitance.

24. The computer readable medium of claim 23 wherein the total intrinsic capacitance is calculated using Nwell capacitance, non-switching capacitance, metal grid capacitance, and internal decoupling capacitance.

25. The computer readable medium of claim 18 wherein instruction (a) further includes the instruction of: determining the noise factors by performing resistance, capacitance, and inductance (RCL) modeling for the power grids and packages using different processes, layer stacks, peak current values, peak with values, and time-to-peak values as inputs.

26. The computer readable medium of claim 18 wherein instruction (b) further includes the instruction of: calculating the decoupling capacitance by, Cdec=noise factor×Q/($\Delta$Vlim).

27. The computer readable medium of claim 26 wherein step (b) further includes the step of: calculating the decoupling capacitance by, Cdec=noise factor×Q/($\Delta$Vlim).

\* \* \* \* \*